Jan. 16, 1968 K. D. RUPPERT 3,364,442

TRANSISTORIZED CAPACITIVE REACTANCE FREQUENCY MODULATOR

Filed Dec. 30, 1966

INVENTOR

KEITH D. RUPPERT

BY Thomas A. Briody

ATTORNEY

United States Patent Office 3,364,442
Patented Jan. 16, 1968

3,364,442
TRANSISTORIZED CAPACITIVE REACTANCE FREQUENCY MODULATOR

Keith D. Ruppert, Decatur, Ill., assignor to General Electric Company, a corporation of New York Filed Dec. 30, 1966, Ser. No. 606,227
6 Claims. (Cl. 332—16)

ABSTRACT OF THE DISCLOSURE

A transistorized capacitive reactance frequency modulator having a high feedback capacitor connected between the collector and base of the modulator stage, an RF choke coupling the modulator driver stage to the modulator stage, an RF choke in the collector circuit of the modulator stage to pass audio frequencies to ground, and smoothing resistors in the collector and emitter circuits of the transistor oscillator stage to reduce the generation of harmonics.

Figures 1, 2:
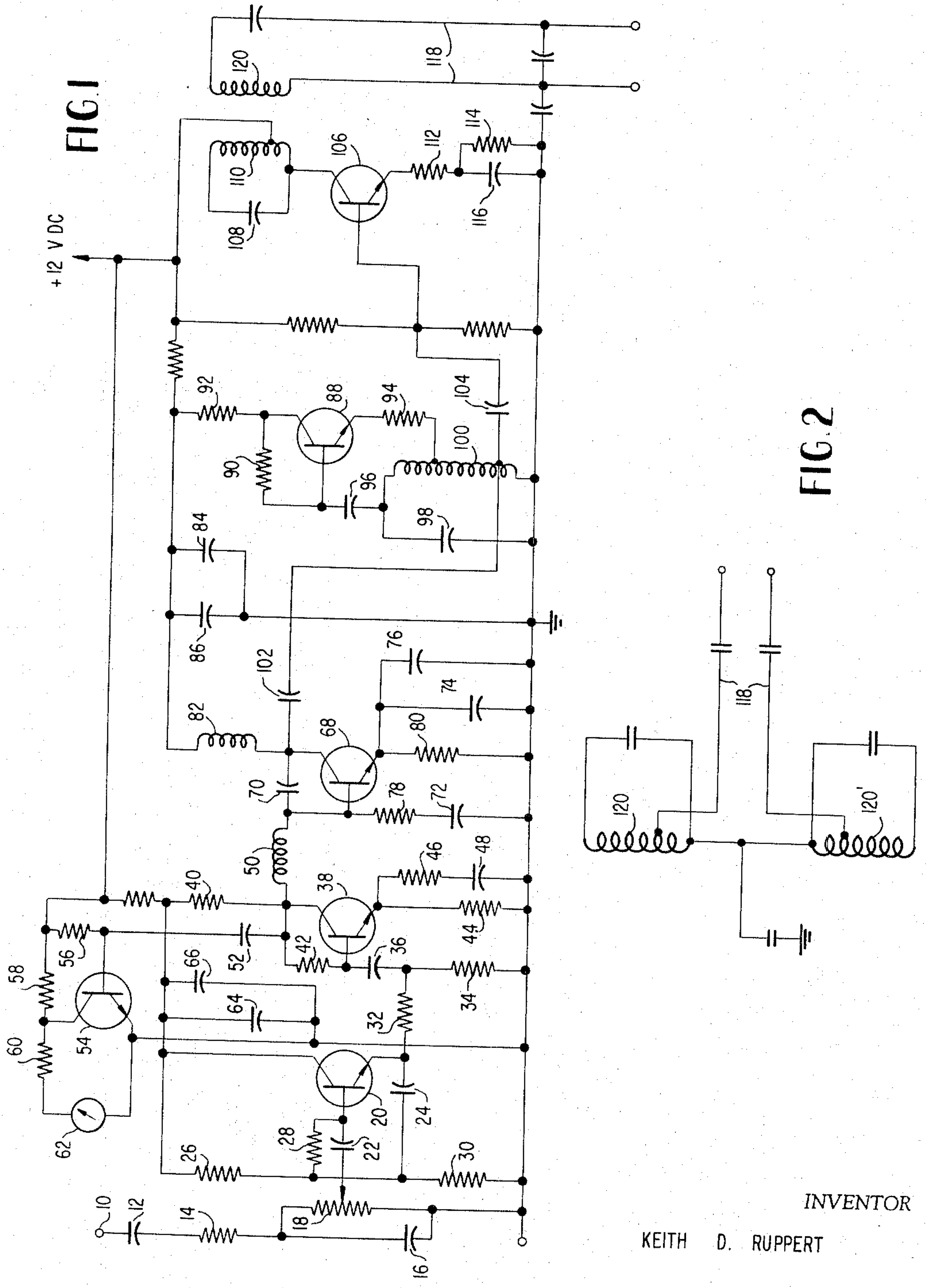

This invention relates in general to frequency modulation, and more specifically to a novel transistorized capacitive reactance frequency modulator particularly adapted to be used with audio frequency signals.

While reactance modulators per se are well known in the prior art, most of them employ vacuum tubes as the active elements whose effective reactance is varied in accordance with the input signal. Although many attempts have been made to transistorize such modulators the normal techniques relied on when substituting transistors for tubes have proved ineffective in this instance, primarily because of the relatively high collector to base capacitance of transistors and also due to their low input impedances.

It is therefore a primary object of this invention to provide a capacitive reactance frequency modulator exclusively employing transistors as the active elements and exhibiting exceptionally broadband, linear modulation.

It is a further object of this invention to provide such a modulator in which the collector-to-base capacitance of the modulator transistor is utilized as a part of the feedback capacitance, which obviates the otherwise detrimental effects of the transistor capacitance.

It is a further object of this invention to provide such a modulator in which the audio signal appearing in the output of the modulator transistor is passed to ground to prevent any amplitude modulation of the carrier signal.

It is a further object of this invention to provide such a modulator in which the transistor carrier frequency oscillator is provided with means to reduce the generation of unwanted harmonics, which might otherwise interfere with AM band radio signals when the modulator is employed in the typical home residence.

It is a further object of this invention to provide such a modulator which employs DC coupling between the modulator driver stage and the modulator stage.

It is a further object of this invention to provide a modulator which may employ a parallel connected output circuit for frequency multiplexing a pair of stereophonic audio based signals on the same power lines.

The foregoing and other objects, features and advantages of the invention will be apparent from the following more particular description of preferred embodiments of the invention, as illustrated in the accompanying drawings, in which:

FIGURE 1 shows a schematic circuit diagram of a complete capacitive reactance frequency modulator and transmitter constructed in accordance with the teachings of this invention, and FIGURE 2 shows a schematic circuit diagram of an alternate output circuit configuration that may be employed with the circuit of FIGURE 1.

Referring now to FIGURE 1 of the drawings, an audio signal applied to input terminal 10 passes through coupling capacitor 12, resistor 14, and the parallel combination of capacitor 16 and potentiometer 18 to ground. This signal may be derived from any suitable source, such as a tape or disc record, a radio receiver, etc. The audio signal is tapped from the wiper arm of the potentiometer and fed to a boot-strapped emitter-follower stage including NPN transistor 20, capacitors 22 and 24, and resistors 26, 28, 30, 32 and 34. The boot strapping raises the input impedance of the emitter-follower stage to a relatively high level, and the ohmic values of resistor 14 and potentiometer 18 are correspondingly high to provide the necessary impedance matching. The voltage divider comprising resistors 32 and 34 in the emitter output circuit of transistor 20 serves to reduce unwanted noise signals that may interfere with the audio signal.

The output from the emitter-follower stage is coupled through the capacitor 36 to a modulator driver stage including NPN transistor 38, resistors 40, 42, 44 and 46 and capacitor 48. This stage operates as a conventional amplifier and provides the necessary amount of signal gain for driving the modulator stage. In addition, it includes a pre-emphasis circuit comprising the series combination of resistor 46 and capacitor 48 connected between the emitter of transistor 38 and ground for boosting the amplitude of the high frequency components of the audio signal, as is common practice in the art.

The collector output from the modulator driver stage is DC coupled to the modulator stage through an RF choke 50 which freely passes the audio signal, but blocks the higher frequency carrier signal and prevents its propagation from the oscillator and modulator stages back into the driver and emitter-follower stages. The DC coupling between the modulator driver and modulator stages and the RF choke 50 are necessary to establish the proper biasing level for the modulator stage, and to isolate the modulator circuit from the driver circuit at the carrier frequency.

The AC output of transistor 38 is also fed, via capacitor 52, to a modulation level sensing circuit comprising NPN transistor 54, resistors 56, 58 and 60 and a galvanometer 62. Transistor 54 is normally biased into conduction which shunts most of the galvanometer current through the collector-emitter path of the transistor. The negative AC applied to the base of the transistor through capacitor 52, representing the audio signal, tends to render the transistor less conductive, however, which diverts more current into the galvanometer, and thus the latter indicates the amplitude level of the audio signal. When this level becomes excessive to the point where the modulator is over-driven and distorts the signal, the input level of the audio signal should be decreased. This is normally accomplished by simply adjusting potentiometer 18.

The parallel capacitors 64 and 66 connected between the power supply line and ground serve to pass AC signals to ground. Capacitor 64 which is of the electrolytic type, presents a very low impedance to audio frequency signals while capacitor 66 has a low impedance for any carrier frequency signals.

The modulator stage, supplied with the audio signal through choke 50, comprises NPN transistor 68, capacitors 70, 72, 74 and 76, resistors 78 and 80, and RF choke 82. The feedback capacitor 70, in combination with the input impedance of transistor 68, including its collector-to-base capacitance, resistor 78 and capacitor 72 form a phase shifting network for the carrier signal so that the collector-to-ground impedance of transistor 68, when viewed from the tank circuit of the carrier frequency oscillator, appears as a pure capacitive reactance shunted by some conductance. Audio signals in the collector circuit of transistor 68 are passed to ground through choke 82 and electrolytic capacitor 84. Capacitor 86 provides a path to ground for any carrier frequency signal not passed by electrolytic capacitor 84. In a similar manner, capacitors 74 and 76 in the emitter circuit of the modulator transistor 68 pass audio and carrier signals, respectively, to ground.

Due to the phase shifting network and the shunting to ground of the audio signals, which prevents any amplitude modulation of the carrier, the modulator stage thus appears largely as a capacitance to the oscillator tank circuit, and this apparent capacitance varies with the gain of transistor 68 under the control of the audio signal.

The carrier frequency oscillator stage is of the class C type and includes NPN transistor 88, resistors 90, 92 and 94, capacitors 96 and 98, and inductor 100. This oscillator produces a relatively pure sinusoidal output with harmonic generation reduced by collector resistor 92 and emitter resistor 94. Resistor 92 buffers the collector of transistor 88 from the power supply voltage and, due to the drop across it when the transistor is conducting, prevents the collector voltage from rising to the 12-volt power supply level except when the transistor is off. This smooths out the oscillator signal to suppress harmonics and limits the amplitude of the signal. Resistor 94 in the emitter circuit provides some negative feedback to compensate for the positive feedback from the inductor 100 to further suppress harmonic generation. This is essential in most home applications of the invention since the carrier frequency is close to the AM radio band, and carrier harmonics would thus interfere with radio reception.

Since the apparent capacitance of the modulator stage is coupled to the inductor 100 in the oscillator tank circuit through capacitor 102, the total capacitance of the tank circuit is thus varied in proportion to the audio signal. This in turn varies the resonant frequency of the tank circuit which effects the desired frequency modulation of the tank circuit which effects the desired frequency modulation of the carrier signal. The modulated carrier is tapped from the inductor 100 as shown and coupled to an output amplification stage through capacitor 104. The amplification stage includes NPN transistor 106, a band pass filter comprising capacitor 108 and inductor 110, resistors 112 and 114, and capacitor 116. The coincidence of the modulator and output taps on inductor 100 is not critical, and these points could be changed by rearranging certain ones of the circuit parameters. Inductor 110 in the band pass filter is the primary winding of the output transformer, and the frequency modulated carrier signal is coupled to the output or transmission lines 118 through the series connected transformer secondary winding 120.

The transmission lines 118 may be the 120-volt 60-cycle power lines of a typical home, in which case the audio input signal may be recovered and reproduced at any outlet socket(s) throughout the house by plugging in a demodulator, amplifier and speaker unit.

For stereophonic applications, the circuitry of FIGURE 1 must be duplicated for the other channel and the two series connected outputs are connected in parallel and then across the power lines.

The alternate output circuit shown in FIGURE 2 is also adapted for stereophonic applications, which would require a duplication of the FIGURE 1 circuitry for the other channel, and drives the lines 118 from a low impedance, parallel source. Each of the transformer secondary windings 120 and 120′ is associated with a different output transformer primary 110, and both windings are connected in series as shown and then across the power lines.

While the invention has been particularly shown and described with reference to preferred embodiments thereof, it will be understood by those skilled in the art that various changes in form and details may be made therein without departing from the spirit and scope of the invention.

What is claimed is:

1. A capacitive reactance frequency modulator comprising:
(a) a carrier signal oscillator stage including a first transistor and an LC tank circuit connected between the emitter and base terminals of the first transistor,
(b) circuit means associated with the oscillator stage for reducing the generation of unwanted carrier frequency harmonics,
(c) an information signal modulation stage including a second transistor,
(d) means connected to the emitter terminal of the second transistor for passing the information and carrier signals to ground,
(e) means connected to the collector terminal of the second transistor for passing only the information signal to ground and blocking the carrier signal,
(f) a feedback capacitor connected between the collector and base terminals of the second transistor and having a relatively high value as compared with the inherent collector to base capacitance of the second transistor,
(g) circuit means connected between the base terminal of the second transistor and ground for shifting the phase of the carrier signal in combination with the feedback capacitor so that the collector to ground impedance of the second transistor, as viewed from the tank circuit, appears substantially capacitive,
(h) means for impressing an information signal on the base terminal of the second transistor, and
(i) means for coupling the collector terminal of the second transistor to the tank circuit.

2. A capacitive reactance frequency modulator as defined in claim 1 wherein the circuit means recited in sub-paragraph (b) of claim 1 comprises a first resistor connected between the collector terminal of the first transistor and a power supply, and a second resistor connected between the emitter terminal of the first transistor and the tank circuit.

3. A capacitive reactance frequency modulator as defined in claim 2 wherein:
(a) the means recited in sub-paragraph (d) of claim 1 comprises a parallel capacitor network, and
(b) the means recited in sub-paragraph (e) of claim 1 comprises an RF choke.

4. A capacitive reactance frequency modulator as defined in claim 3 wherein the circuit means recited in sub-paragraph (g) of claim 1 comprises a resistor and capacitor connected in series.

5. A capacitive reactance frequency modulator as defined in claim 4 further comprising:
(a) a modulator driver stage including a third transistor for amplifying the information signal, and wherein
(b) the means recited in sub-paragraph (h) of claim 1 comprises and RF choke connected between the collector terminal of the third transistor and the base terminal of the second transistor.

6. A capacitive reactance frequency modulator as defined in claim 1 further comprising:
(a) a pair of output transformers each having a primary winding and a secondary winding,
(b) means for coupling the modulated carrier signal in the tank circuit to the primary winding of one of the output transformers, and (c) means connecting the secondary windings of the output transformers in series across a pair of output lines, whereby two modulated carrier signals of different frequencies may be multiplexed on the output lines by connecting a second modulated carrier signal to the primary winding of the other output transformer.

No references cited.

JOHN KOMINSKI, *Primary Examiner.*

ROY LAKE, *Examiner.*